(12) United States Patent
Kim et al.

(10) Patent No.: US 9,426,911 B2
(45) Date of Patent: Aug. 23, 2016

(54) PROTECTIVE APPARATUS FOR ELECTRONIC DEVICE

(71) Applicant: Samsung Electronics Co., Ltd., Gyeonggi-do (KR)

(72) Inventors: Hyunchul Kim, Gyeonggi-do (KR); Mingeun Kim, Seoul (KR); Yunjin Park, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 41 days.

(21) Appl. No.: 14/301,574

(22) Filed: Jun. 11, 2014

(65) Prior Publication Data

US 2014/0374309 A1 Dec. 25, 2014

(30) Foreign Application Priority Data

Jun. 20, 2013 (KR) .................. 10-2013-0071126

(51) Int. Cl.
| | |
|---|---|
| *H05K 5/03* | (2006.01) |
| *G06F 1/16* | (2006.01) |
| *A45C 11/00* | (2006.01) |
| *B29L 31/34* | (2006.01) |
| *B29C 65/08* | (2006.01) |
| *B29L 31/00* | (2006.01) |
| *B29C 65/00* | (2006.01) |
| *A45C 11/38* | (2006.01) |

(52) U.S. Cl.
CPC ......... *H05K 5/03* (2013.01); *A45C 11/00* (2013.01); *G06F 1/1626* (2013.01); *G06F 1/1628* (2013.01); *A45C 11/38* (2013.01); *A45C 2011/002* (2013.01); *B29C 65/08* (2013.01); *B29C 66/54* (2013.01); *B29C 66/71* (2013.01); *B29L 2031/3437* (2013.01); *B29L 2031/3481* (2013.01); *B29L 2031/764* (2013.01)

(58) Field of Classification Search
CPC ............... A45C 2011/002; B29L 2031/3437; H05K 5/03
See application file for complete search history.

(56) References Cited

U.S. PATENT DOCUMENTS

| | | | |
|---|---|---|---|
| 8,770,402 B2 * | 7/2014 | Bergreen | A45C 11/22 206/305 |
| 2011/0163642 A1 | 7/2011 | Rohrbach et al. | |
| 2012/0068919 A1 * | 3/2012 | Lauder | G06F 1/1656 345/156 |
| 2012/0111755 A1 | 5/2012 | Harata et al. | |
| 2012/0211382 A1 * | 8/2012 | Rayner | G06F 1/1626 206/320 |
| 2012/0275025 A1 * | 11/2012 | Parrill | G02B 23/16 359/511 |
| 2012/0298535 A1 * | 11/2012 | Sirichai | A45F 5/02 206/45.23 |
| 2013/0082963 A1 * | 4/2013 | Chu | G03B 17/08 345/173 |
| 2013/0099636 A1 * | 4/2013 | Igarashi | H05K 5/03 312/223.1 |
| 2013/0199948 A1 * | 8/2013 | Lebauer | B65D 81/02 206/216 |

(Continued)

FOREIGN PATENT DOCUMENTS

| | | | | |
|---|---|---|---|---|
| JP | 2010-128162 A | 6/2010 | | |
| WO | WO 2013025030 A2 * | 2/2013 | ........... | H04B 1/3888 |

*Primary Examiner* — Anthony Stashick
*Assistant Examiner* — Mollie Llewellyn
(74) *Attorney, Agent, or Firm* — Cha & Reiter, LLC

(57) ABSTRACT

Disclosed herein is a protective apparatus for an electronic device. A first cover encloses a peripheral surface of the electronic device and a second cover, coupled to a lateral side of the first cover, rotates about a surface of the electronic device to cover or uncover a display unit.

17 Claims, 11 Drawing Sheets

(56) References Cited

U.S. PATENT DOCUMENTS

| | | | |
|---|---|---|---|
| 2013/0258586 A1* | 10/2013 | Shao | A45C 11/00 361/679.55 |
| 2013/0319897 A1* | 12/2013 | Hsu | G06F 1/1628 206/472 |
| 2014/0159839 A1* | 6/2014 | Kim | H04B 1/3888 335/219 |
| 2014/0185206 A1* | 7/2014 | Kim | H05K 5/0017 361/679.01 |
| 2014/0210803 A1* | 7/2014 | Oh | G09G 3/20 345/207 |
| 2014/0298062 A1* | 10/2014 | Lee | H05K 5/03 713/323 |

\* cited by examiner

PROTECTIVE APPARATUS FOR ELECTRONIC DEVICE

CROSS-REFERENCE TO RELATED APPLICATION

This application claims priority from and the benefit under 35 U.S.C. §119(a) of Korean Patent Application No. 10-2013-0071126, filed on Jun. 20, 2013, which is hereby incorporated by reference herein.

BACKGROUND

1. Field

The present disclosure relates to a protective apparatus for an electronic device, and more particularly to a protective apparatus for an electronic device which is capable of protecting elements mounted inside and outside of an electronic device.

2. Description of Related Art

Thanks to recent remarkable developments in communication and semiconductor technologies, the distribution and use of portable terminals have increased rapidly. Such electronic devices are continuously being miniaturized and improved. In addition to providing general telecommunication, such portable terminals may have various other functions, such as an MP3 function, an image collection function etc. Furthermore, some terminals allow users to play mobile games, arcade games, or the like.

Furthermore, some portable terminals comprise digital cameras equipped with large-sized lenses. Such devices may be equipped with a lens barrel and may include a 4.3-inch display with QHD 960*540 resolution; a 16-M pixel sensing unit having an optical zoom function incorporated in a 1.6 GHz dual core processor; a 8 GB on-board memory; and an external micro SD slot expandable up to 64 GB. These devices may be further provided with a camera shutter button, a zoom button, etc. and may be referred to as a camera phone.

An ordinary camera phone may include a display device on a front side and a lens barrel on the rear side. The display device and the lens are susceptible to external impact since they are formed using a glass material. In addition, the lens barrel, which protrudes from the body of the electronic device, may be scratched by external friction. At present, however, these phones are not provided with adequate protection. Therefore, when the camera phone encounters external impact (e.g., when it is dropped), the external impact may not be properly absorbed or dispersed. As a result, the display device, the lens, or internal parts may be damaged.

In addition, since the rear side of the camera phone includes a relatively heavy lens barrel and the front side of the camera phone has a display screen, the front side and the rear side weigh differently. In addition, camera phones may not be manufactured beyond a predetermined thickness, since they are intended to be portable and easy to carry. As such, conventional camera phones may not be able to overcome the imbalance in weight between its front and rear side.

SUMMARY

In view of the foregoing, disclosed herein is a protective apparatus for an electronic device capable of preventing damage by external impact.

In one example, a protective apparatus may be used to control execution of functions in the electronic device.

In another example, a structure and a process capable of strengthening coupling between parts of a protective apparatus are disclosed.

In yet another example, a protective apparatus for an electronic device may support the electronic device while the electronic device is being used.

In one aspect of the present disclosure, a protective apparatus may include a first cover to enclose a peripheral surface of the electronic device and a second cover, coupled to a lateral side of the first cover, to rotate about a surface of the electronic device to cover or uncover a display unit formed on the surface of the electronic device.

As described above, a protective apparatus for an electronic device according to the present disclosure can prevent the electronic device from being damaged by external impact by employing a peripheral cover and a flip cover.

In addition, the present disclosure discloses a physical coupling and a chemical coupling between elements of the protective apparatus which are formed from different materials. As a result, the elements of the protective apparatus which are independently fabricated in separated forms can be strongly coupled in order to enhance the rigidity of the protective apparatus.

Further, according to the present disclosure, a flip cover is provided with a sensing unit so as to detect the state between the flip cover and a display unit of an electronic device through the sensing unit. As a result, the display unit of the electronic device can be controlled accordingly.

Moreover, when a camera function of an electronic device is used, a camera phone may be stably supported on a flat surface using a support recess formed on a lens barrel to make the camera easier to use.

BRIEF DESCRIPTION OF THE DRAWINGS

The above features and advantages of the present disclosure will be more apparent from the following detailed description in conjunction with the accompanying drawings, in which.

DETAILED DESCRIPTION

Figure 1:
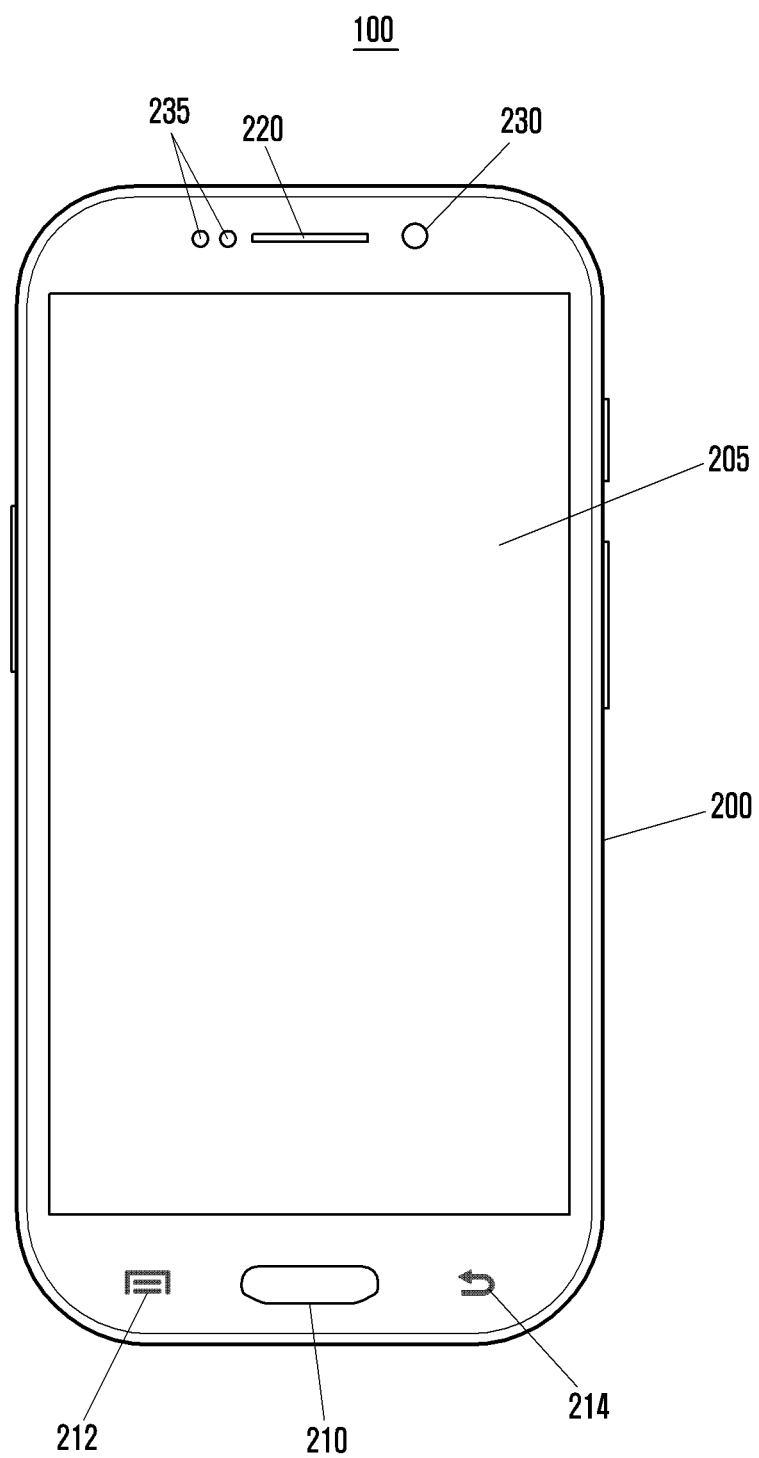
FIG. 1 is a schematic front view of an example camera phone.

Hereinafter, examples of the present disclosure will be described in detail with reference to the accompanying drawings. It should be noted that the same elements will be designated by the same reference numerals although they are shown in different drawings. Furthermore, a detailed description of known functions and configurations incorporated herein will be omitted when it may make the subject matter of the present disclosure rather unclear.

Meanwhile, examples disclosed in the specification and drawings are merely presented to easily describe technical contents and to aid the understanding of the techniques herein. Thus, the examples herein are not intended to limit the scope of the present disclosure as defined by the appended claims. It is understood that modifications may be made on the basis of the spirit and scope of the present disclosure.

An electronic device may be a mobile communication electronic device, a smart phone, a tablet Personnel Computer (PC), or a Personal Digital Assistant (PDA). An electronic device may also be a portable electronic device that includes a touch screen and a lens barrel such as a portable phone, a smart phone, a tablet PC, or a notebook PC. An accessory in the present disclosure may be a component of an electronic device which may be separated from the electronic device, for example, a pen configured to touch a touch screen, a headphone, a keypad, or a lens cover.

Examples of a protective apparatus will be described below in detail. Terms and words used below shall not be construed limitatively as conventional or dictionary definitions but construed as meanings and concepts in the context of the present disclosure. Accordingly, it shall be noted that the following description and accompanying drawings merely disclose examples of the present disclosure rather than representing every technical detail, and thus, various equivalents and modifications may exist at the time of filing the present application. In addition, some components in the accompanying drawings may be exaggerated, omitted, or schematically illustrated.

Figure 2:
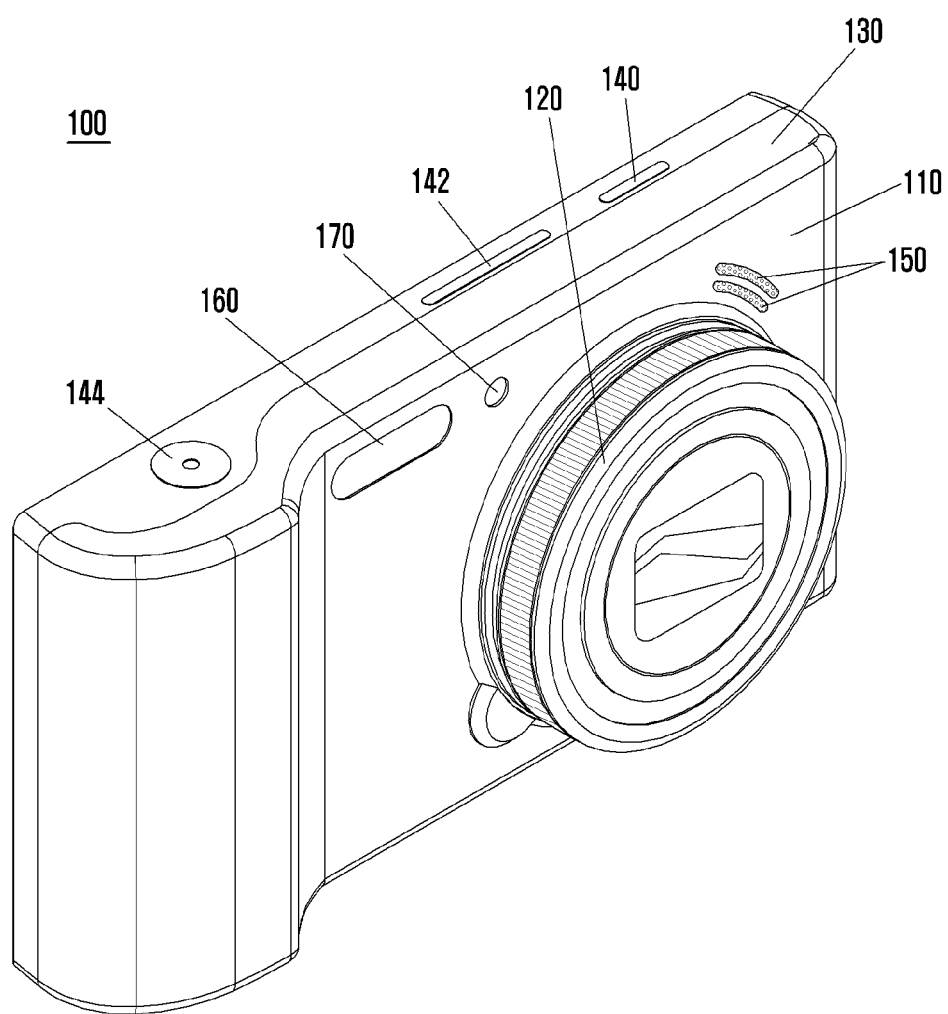
FIG. 2 is a schematic rear side view of an example camera phone.
Figure 3:
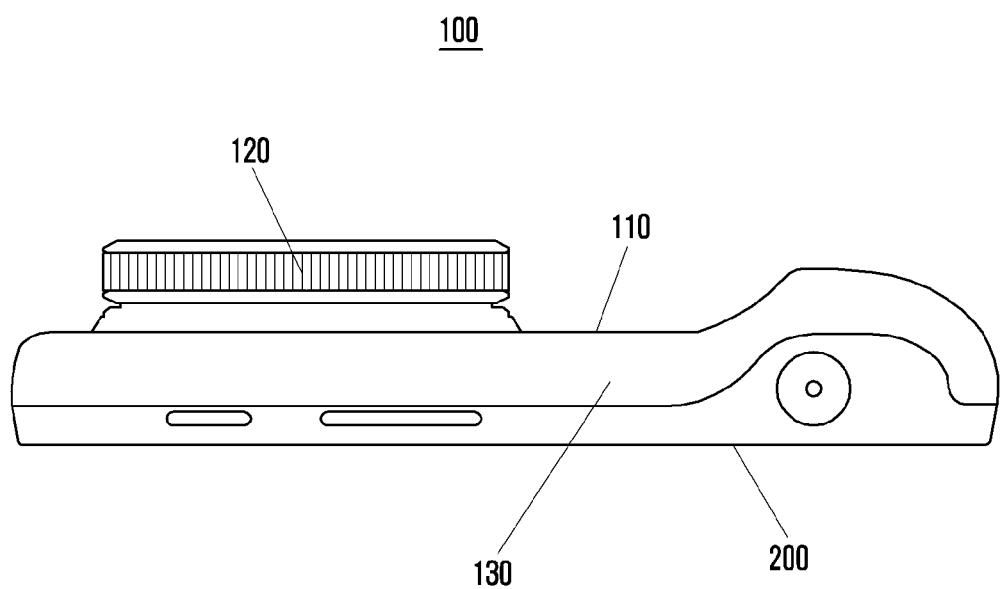
FIG. 3 is a schematic top plan view of an example camera phone.

FIG. 1 is a schematic front view of an example camera phone, FIG. 2 is a schematic rear side perspective view of the example camera phone, and FIG. 3 is a schematic top plan view of the example camera phone.

Referring to FIG. 1, a electronic device 100 may include a construction of a portable terminal device on the front side 200 thereof. That is, electronic device 100 may include a display unit 205 in the central area of the front side 200, a receiver 220, an illuminance sensing unit 235, an auxiliary camera 230 may be positioned at the upper end of the display unit 205, and a plurality of keys may be positioned at the lower end of the display unit 205. The plurality of keys may include, for example, a home key 210, a menu key 212, and a cancel key 214 which may be formed as button-type physical keys or touch keys. The display unit 205 may display an application execution screen, a home screen, a lock screen, or the like and sense an event input by a user so as to control the screens. In addition, the display unit 205 may include a touch panel and a display panel. The receiver 220 may provide an output function of an audio signal (e.g., call voice, MP3 reproducing sound, etc.). The illuminance sensing unit 235 may sense peripheral brightness and send a signal such that the electronic device 100 may adjust the brightness of a screen. The auxiliary camera 230 may provide a video call function and a self-camera function.

Referring to FIG. 2, the electronic device 100 may include a construction of a camera device on the rear side 110 thereof. That is, on the rear side 110, the electronic device 100 may include a lens barrel 120 and may also include a speaker 150, a flash 160, and an AF support light 170. In addition, although not illustrated, the electronic device 100 may further include a micro SD card slot for a memory card inlet/outlet and a tripod hole for connecting a tripod on a bottom side.

The lens barrel 120 may include at least one lens to pass an image of a subject positioned in front of the lens. A conventional lens barrel may include one or more lenses to focus on the subject or to zoom on the object. The lens barrel 120 may be fixed to or removable from an insertion portion formed on the rear side 110 of the electronic device.

Referring to FIG. 3, the electronic device 100 may include a button associated with a portable phone function and a button associated with a camera function on the top side 130. Specifically, on the top side 130, the electronic device 100 may include a power button 140 and a volume button 142 associated with the portable phone terminal function and a camera button 144 associated with the camera function.

Figure 4:
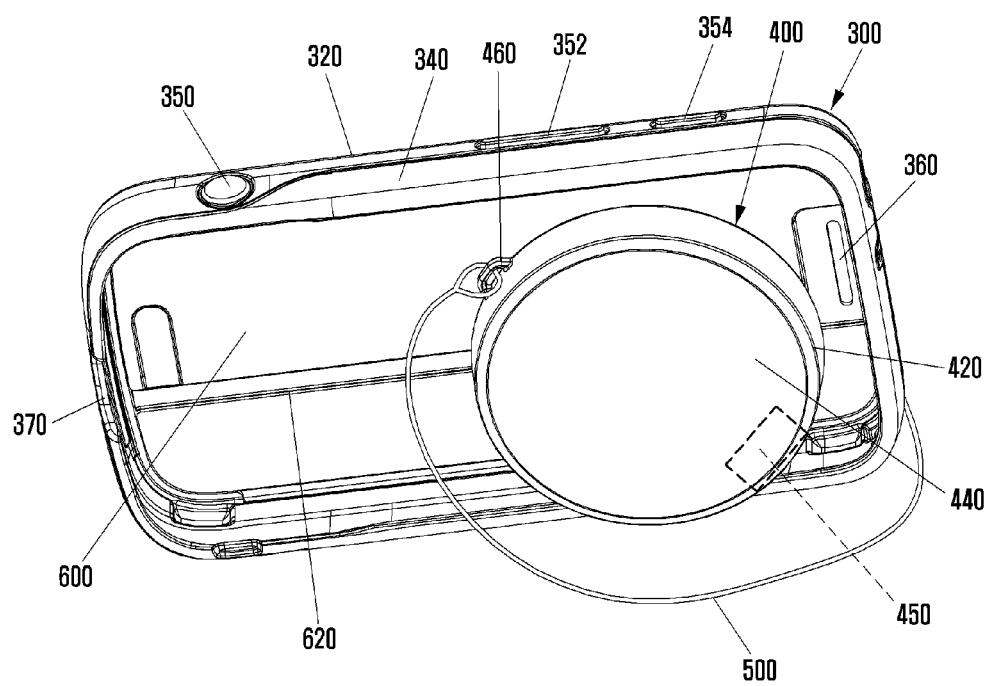
FIG. 4 is a front side perspective view of an example protective apparatus in accordance with aspects of the present disclosure.
Figure 5:
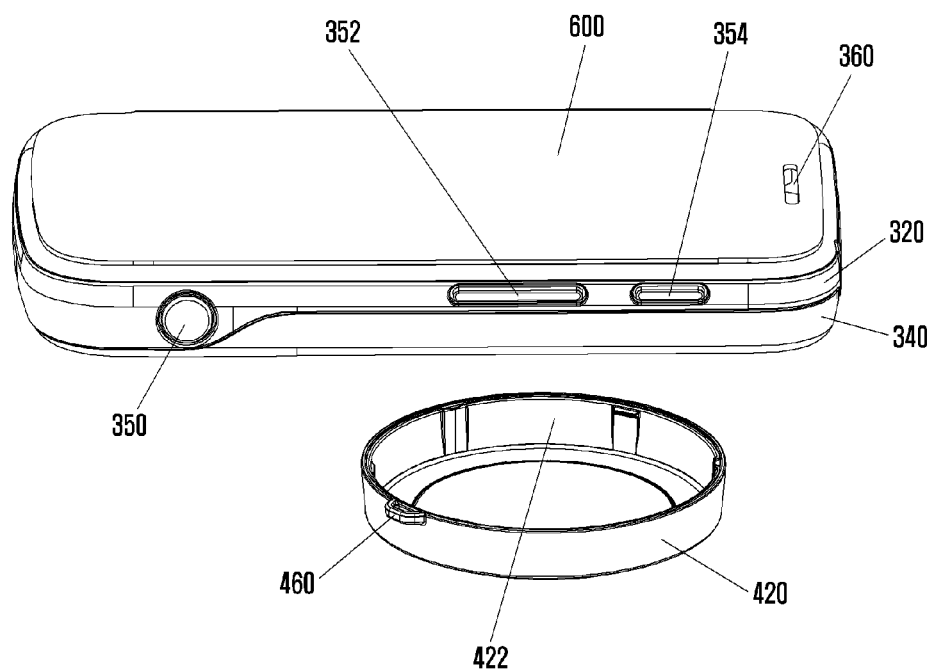
FIG. 5 is a lateral side perspective view of an example protective apparatus in accordance with aspects of the present disclosure.

FIG. 4 is a front side perspective view of an example protective apparatus for an electronic device, and FIG. 5 is a lateral side perspective view of the example protective apparatus. Referring to FIGS. 4 and 5, the protective apparatus may include a peripheral cover 300, a flip cover 600, and a lens barrel cover 400.

In one example, the peripheral cover 300 may be referred to as a first cover, and the flip cover 600 may be referred to as a second cover. In one example, the flip cover 600 may be made of at least one of polycarbonate and an elastomer.

The peripheral cover 300 may enclose a peripheral surface of the electronic device 100. That is, the peripheral cover 300 may come in close contact with a left, right, top, and bottom of the peripheral surface to protect the electronic device 100 from external impact or scratching. The peripheral cover 300 may include a plurality of holes or external interfaces such that, for example, an earphone jack insertion hole and an external antenna of electronic device 100 may be exposed when the electronic device 100 is fitted on the peripheral cover 300. In addition, when a strap is used to make the protective apparatus receive the lens barrel cover 400, the peripheral cover 300 may include a hole to tie the strap. Further, the peripheral cover 300 may include a nail groove 370 at a side edge thereof so as to remove the peripheral cover 300 from the electronic device 100.

Peripheral cover 300 may be manufactured with two different materials fabricated in a single structure through a dual injection molding process. Here, the peripheral cover 300 may be a construction in which a first peripheral cover 320 and a second peripheral cover 340 are coupled. However, the peripheral cover 300 is not limited to this and may employ a construction in which two or more different materials are coupled to each other.

The first peripheral cover 320 may be of a soft material so as to transfer pushing pressure to power button 140, the volume button 142, and the camera button 144 provided on the top side 130 of the electronic device while covering the buttons.

For example, the first peripheral cover 320 may be made of a soft rubber material or synthetic resin material which is elastic so as to transfer a pushing pressure to a button in close contact therewith. Such material may be excellent in surface adhesive force so as to provide a close contact force with the surface of the electronic device 100 and may be flexible so as to facilitate mounting or removal of the electronic device 100.

In one example, a silicon material or a urethane material such as thermoplastic poly urethane (TPU) may be used.

In addition, in order to ensure that an external pressure to be applied to each button may be practically transferred to the button more smoothly, the inner surface portions of the first peripheral cover 320 facing the buttons may protrude by a predetermined height in a direction facing the buttons. The outer surface portions of the first peripheral cover 320 corresponding to the buttons may be formed to protrude outward in accordance with the shapes of the buttons protruding from the surface of the electronic device 100.

The second peripheral cover 340 may be made of a hard material which is more rigid and stiffer than the first peripheral cover 320 in order to increase the rigidity of the peripheral cover 300. For example, the second peripheral cover 340 may be made of one of acrylonitrile butadiene styrene (ABS), polyamide (PA), polyacetal (POA), polycarbonate (PC), modified polyoxide (M-PRO), poly(butylene terephthalate) (PBT), polyimide (PI), polyphenylene sulfide (PPS), polyamide imide (PAI), polyether imide (PEI), polyether ketone (PEK), liquid crystal polyester (LCP), syndiotactic polypropylene (SPP), silicon, a rubber, a metal, and an inorganic material, or a combination thereof.

The first peripheral cover 320 and the second peripheral cover 340 of peripheral cover 300 may coupled to each other through a dual injection molding process. The flip cover 600 may cover the front side of the electronic device 100 in such a manner that the display unit 205, for example, a liquid crystal device, is not exposed when the electronic device 100 is not in use. Flip cover 600 may be removed to expose the display unit 205 when the display unit 205 is in use.

The outer surface of the flip cover 600 may be provided with a sheath configured to enclose the entire flip cover 600. The sheath may be at least one of rubber, urethane, silicon, leather, artificial leather, and fabric. The sheath of the flip cover 600 may include a stiffener more rigid and stiffer than the sheath to the exclusion of a bending line 620, which will be illustrated below with reference to FIG. 8.

The inner surface of the flip cover 600, i.e. the portion facing the display unit 205 of the electronic device 100, may be provided with a soft material so as to prevent the surface of the display unit 205 from being scratched by external friction. The soft material may be, for example, chamude, artificial leather, suede fabric, microfiber, etc.

Figure 6:
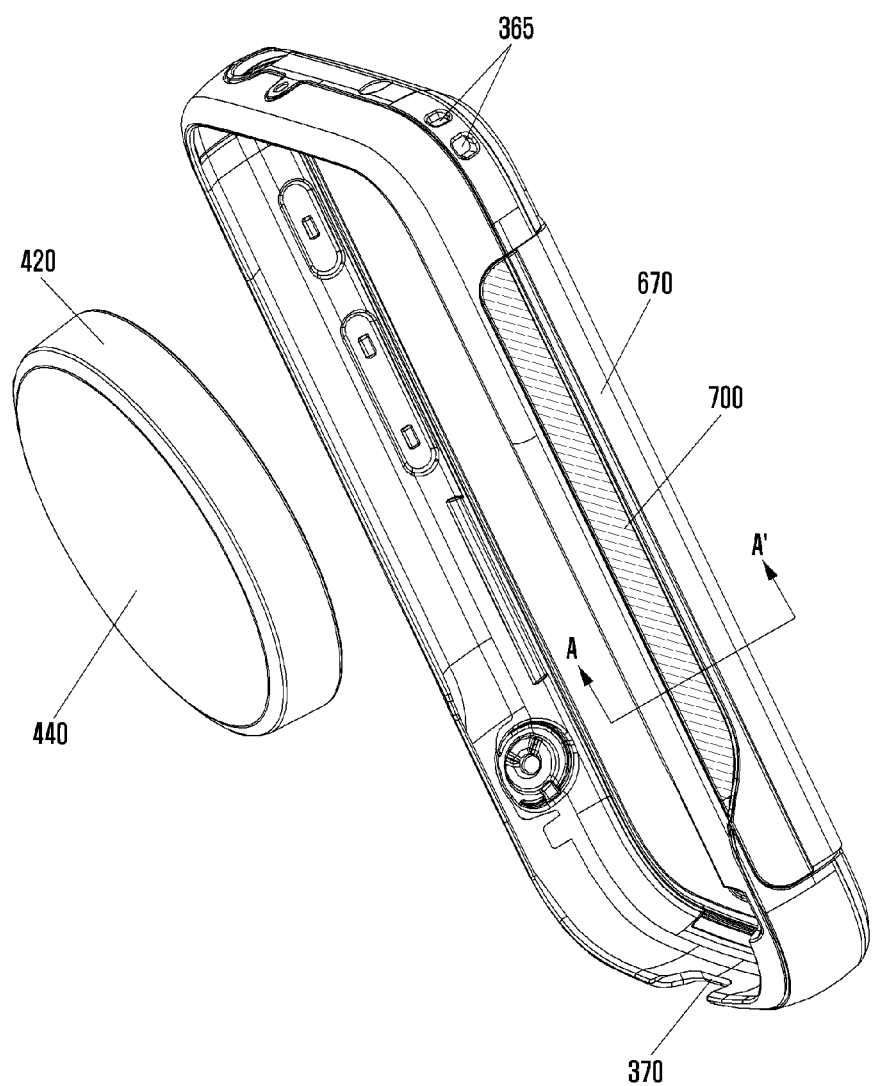
FIG. 6 is a view for describing an example coupling structure of the peripheral cover and the flip cover in accordance with aspects of the present disclosure.
Figure 7:
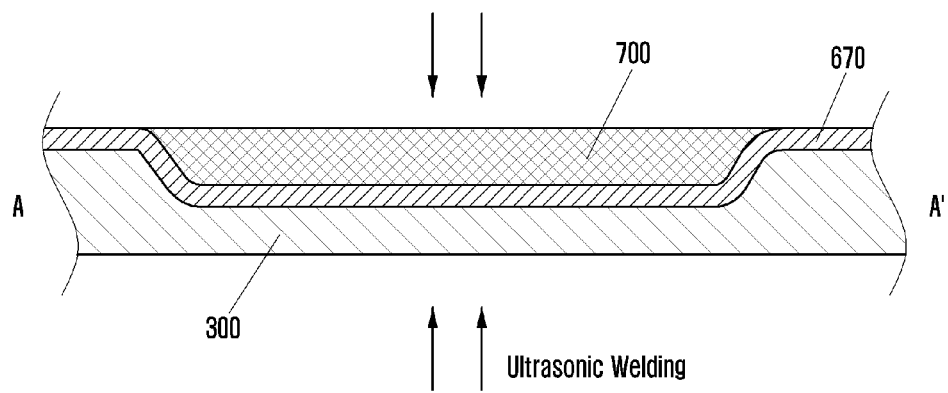
FIG. 7 is a view illustrating a cross section (taken along line A-A' of FIG. 6) of the example peripheral cover and the flip cover in accordance with aspects of the present disclosure.

FIG. 6 is a view for describing an example coupling structure of the peripheral cover and the flip cover and FIG. 7 is a view illustrating an example cross section (taken along line A-A' of FIG. 6) of the peripheral cover and the flip cover. A function of controlling the execution of functions of the electronic device 100 using the flip cover 600 will be described below with reference to FIGS. 8 and 9.

Referring to the examples in FIGS. 6 and 7, the flip cover 600 may be coupled via portion 670 to the peripheral cover 300 such that the flip cover 600 may be rotated about an axis at a boundary between the electronic device 100 and the peripheral cover 300 to cover or uncover the display unit 205 of the electronic device 100.

In particular, the peripheral cover 300 and the flip cover 600 of the present disclosure may be manufactured by independently fabricating peripheral cover 300 and flip cover 600 in a separated form and then coupling them to each other by fitting and ultrasonic welding, as shown in FIG. 7.

In one example, a recess with a predetermined depth is formed at a portion of the peripheral cover 300 to allow a portion 670 of the flip cover 600 to be received in the recess, and to allow a locker 700 to be stacked thereon. At this time, the portion 670 of the flip cover and the locker 700 may be fitted in the recess formed at the portion of the peripheral cover 300. For example, the peripheral edge of the recess may be formed in a shape of an engaging step and the peripheral edges of the portion 670 of the locker 700 of the flip cover may be formed to be engaged therewith.

The peripheral cover 300, the portion 670 of the flip cover, and the locker 700 may be coupled to each other more strongly through an ultrasonic welding process in addition to the above-described structural coupling.

The ultrasonic welding refers to a processing method in which an electric energy of 60 Hz power is converted into a mechanical energy through an oscillator, and then the mechanical energy is applied to workpieces through a horn. Then, intense frictional heat may be generated temporarily on to-be-coupled surfaces of the workpieces such that the to-be-coupled surfaces are welded to each other. That is, the ultrasonic welding is a processing method that causes intense molecular bonding.

In other examples, the peripheral cover 300 and the flip cover 600 may be independently fabricated in separated forms and then the corresponding sides thereof may be coupled to each other in a hinge manner, or fabricated in an integrated single structure through a single injection molding process.

Referring again to FIGS. 4 and 5, the lens barrel cover 400 may serve as a protective cover configured to protect the lens mounted in the lens barrel from external impact or friction.

Referring to FIG. 5, at a portion of the periphery of the lens barrel cover 400, a string connector 460 may be formed in a protruding form. Referring back to FIG. 4, the protective apparatus may be additionally provided with the lens barrel cover 400 when one end of a strap 500 is tied to the string connector 460 and the other end of the strap 500 is tied to the hole formed in the peripheral cover 300. With this configuration, the lens barrel cover 400 may be detached from and attached to the protective apparatus. The strap 500 may be provided as a string formed from one of a flexible material and a non-flexible material.

For example, a portion of the lens barrel cover 400 facing the lens may be made of a material such as a transparent polycarbonate. As shown in FIG. 5, an inner circumferential surface 422 of the lens barrel cover 400 may be adapted to be in substantially close contact with the lens barrel 120. Inner circumferential surface 422 may be made of a soft rubber material or synthetic material which is flexible to be easily mounted on or removed from the lens barrel 120. Such soft rubber or synthetic material may have a strong surface adhesive force such that inner circumferential surface 422 may at least partially cling to lens barrel 120. The synthetic material may be a silicon material or a urethane material, such as TPU.

Figure 8:
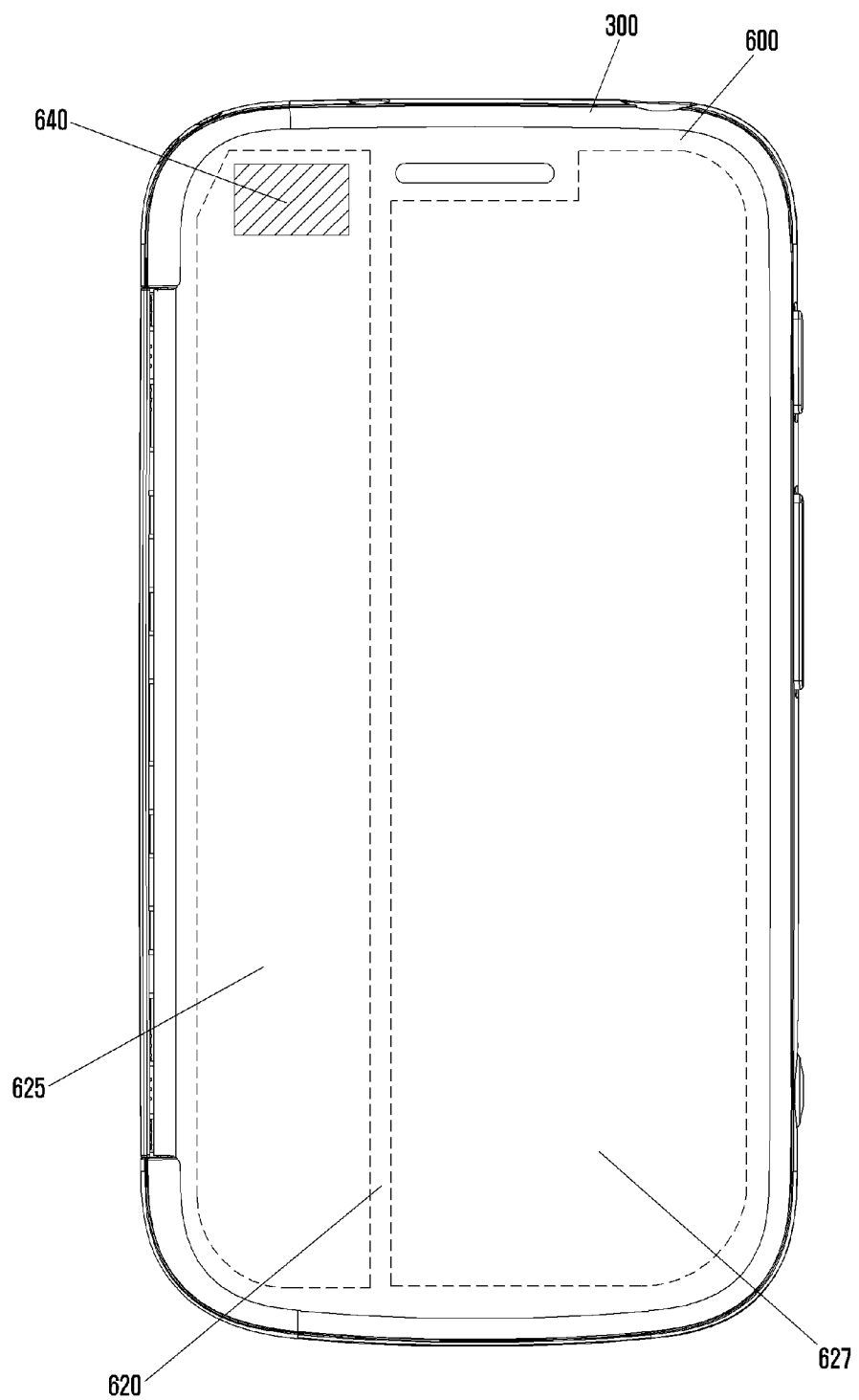
FIG. 8 is a view illustrating an example outer surface of the flip cover in accordance with aspects of the present disclosure.
Figure 9:
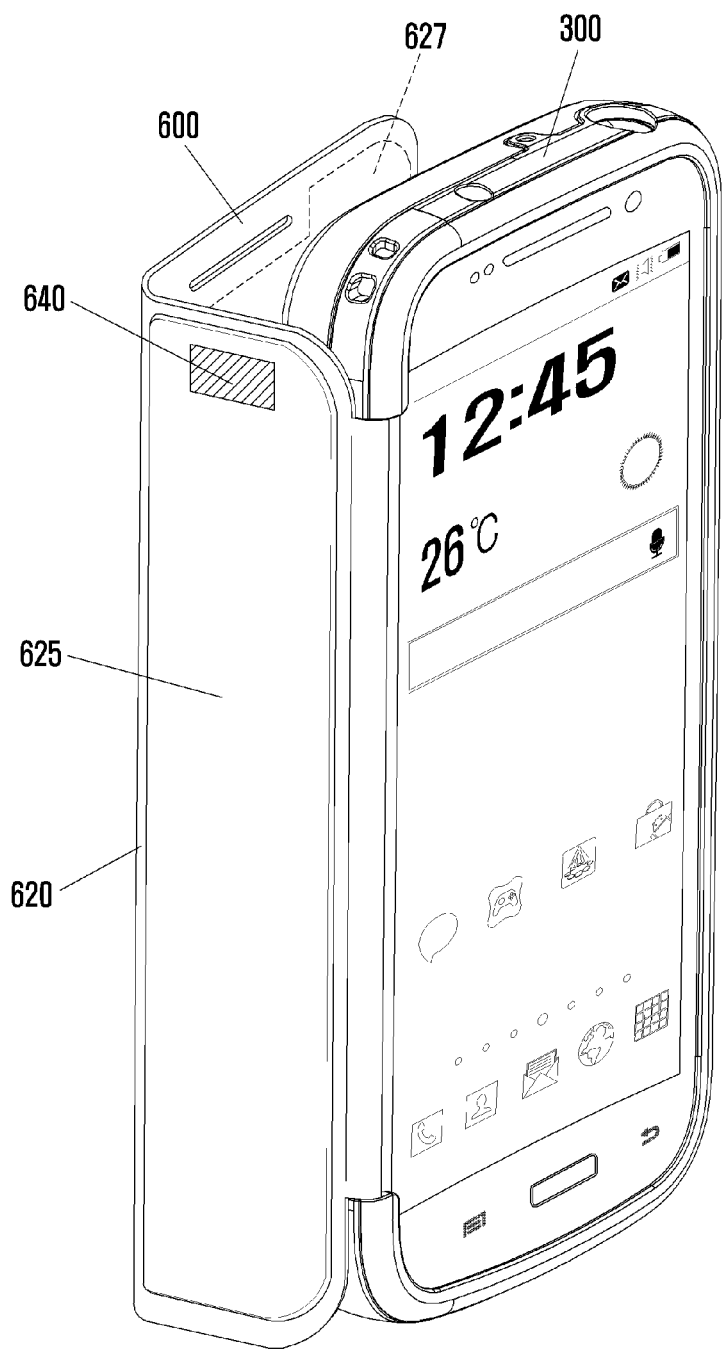
FIG. 9 is a view illustrating an inner surface of the example flip cover in accordance with aspects of the present disclosure.
Figure 10:
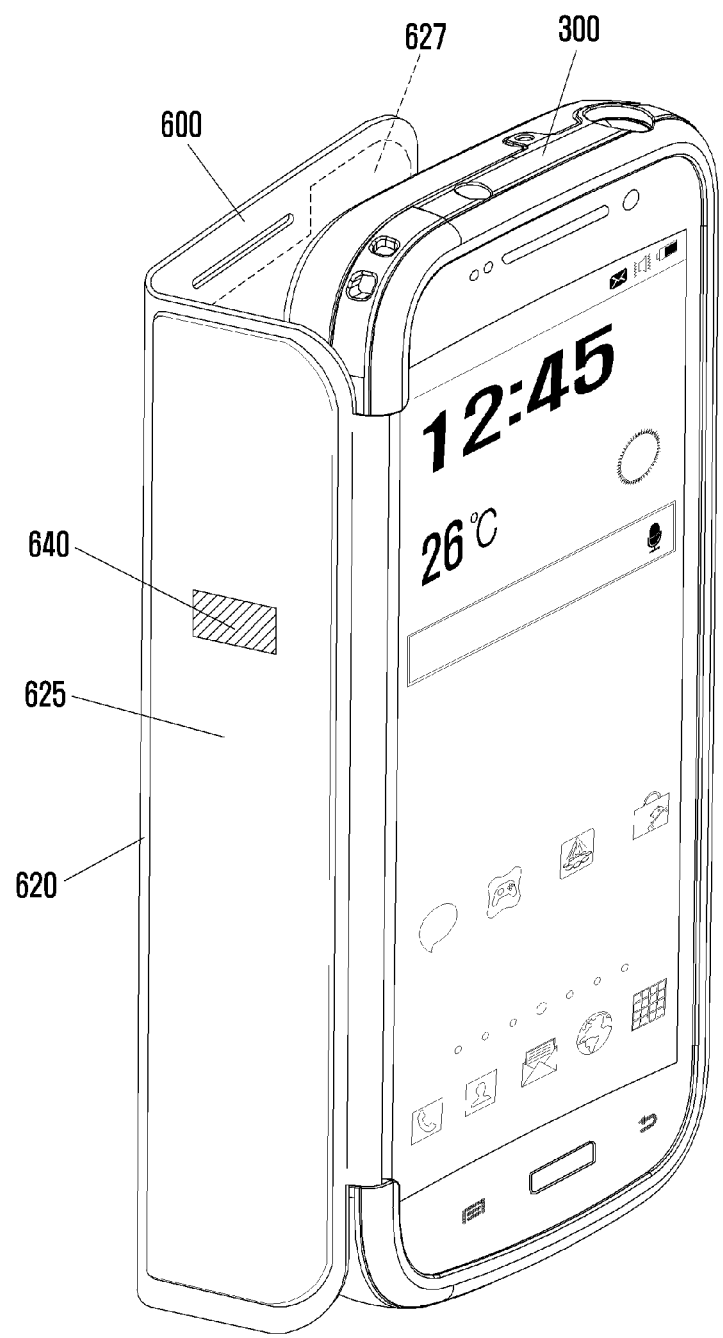
FIG. 10 is a view for describing an example sensing unit on the flip cover in accordance with aspects of the present disclosure.

FIG. 8 is a view illustrating an example outer surface of the flip cover when convering the electronic device. FIG. 9 is a view illustrating an inner surface of the example flip cover when uncovering the electronic device, and FIG. 10 is a view for describing an example sensing unit provided on the flip cover.

Referring to FIGS. 8 and 9, the flip cover 600 may include at least one bending line 620 so as to make the flip cover 600 bendable.

The bending line 620 may be formed on an empty, sheath surrounded portion of flip cover 600. This empty space may not include a hard stiffener. As illustrated in FIG. 9, the bending line 620 may be bent to a predetermined angle. When the flip cover 600 is implemented in this manner, flip cover 600 may be prevented from folding on top of the protruding lens barrel 120, when the flip cover 600 is folded toward rear side 110 of the electronic device 100, such that at least partial contact with a rear side of electronic device 100 is made.

Of the portions of the flip cover 600 separated by the bending line 620, the portion adjacent to the electronic device 100 may have a width L corresponding to the sum of the thickness of the electronic device 100 and the height of the lens barrel 120 covered by the lens barrel cover 400. As a result, when the flip cover 600 is folded toward the rear side 110 of the electronic device 100, the portion of the flip cover 600 to come into contact with the lens barrel 120 may be folded along the bending line 620 such that this portion of flip cover 600 is parallel to the surface of rear side 110. Accordingly, when a user holds electronic device 100 while the flip cover 600 is uncovered, the user's grip may not be diminished by flip cover 600.

Although not illustrated in the drawings, the flip cover 600 may include a plurality of bending lines such that the flip cover 600 may be bent in different directions. When the bending lines are bent at predetermined angles, the flip cover 600 may be used as a support for the electronic device 100. That is, in the state where a portion of the flip cover 600 is in close contact with the rear side 110 of the electronic device 100, the remaining portion of the flip cover 600 may be in close contact with some flat surface (e.g., a floor, a table, etc.) to support the weight of the electronic device 100.

As shown in FIG. 9, the flip cover 600 may comprise a sensing unit 640. The sensing unit 640 may detect whether the flip cover 600 covers or uncovers the display unit 205. The sensing unit 640 may comprise a magnetic material, and a hall sensor included inside the electronic device 100 may detect the approach of the magnetic material so as to determine whether the flip cover 600 is uncovered or covered. The hall sensor may transfer detected information as to whether the flip cover 600 is uncovered or covered such that at least one processor such as a CPU (Central Processing Unit) or an AP (Application processor) may control the execution of the electronic device 100 accordingly.

For example, upon receiving a signal indicating that the flip cover 600 covers display unit 205, at least one processor may switch the screen of the display unit 205 into a sleep mode. On the contrary, upon receiving a signal indicating that the flip cover 600 is not covering display unit 205, at least one processor may switch the screen of the display unit 205 into an active mode for a predetermined length of time until a user's input is detected.

As described above, the hall sensor may be positioned at the upper end of electronic device 100 outside the display unit 205 and the magnetic material of the sensing unit 640 may be positioned at the upper end of the flip cover 600 to face the position of the hall sensor as illustrated in FIGS. 8 and 9. When the magnetic material and the hall sensor of the sensing unit 640 are arranged at the upper ends to be spaced apart from the display unit 205 of the electronic device 100 by a predetermined distance as described above, a magnetic influence may be minimized. The magnetic material of the sensing unit 640 may be provided inside the sheath that forms the outer surface of the flip cover 600 or on the outer surface.

Apart from the magnetic material detected through the hall sensor, the sensing unit 640 may also comprise a specific pattern as illustrated in FIG. 10. The sensor or the specific pattern may be provided so as to detect a motion of the flip cover 600 moving away from the display unit 205 and a distance between the flip cover 600 and the display unit 205.

When the sensing unit 640 is utilized, an interface unit (not illustrated) may be further provided so as to transfer a sensing result of the sensor to at least one processor inside electronic device 100. The interface unit may be an element that implements a wired interconnect between the sensor and at least one processor. The wired interconnect may comprise a cord wire, a connection jack or the like.

The sensor may be configured as a contactless type sensor or a contact type sensor. For example, at least one of a micro switch and a limit switch may be used as the contact sensor and at least one of a photo sensor, a illumination sensor, a distance sensor, a position sensor, a hall sensor, a motion sensor, a proximity sensor, a gyro-sensor, and an acceleration sensor may be used as the contactless type sensor.

As noted above, the sensing unit 640 may be provided with a specific pattern. The specific pattern of the sensing unit 640 may be detected in the same manner as the method of detecting a touch pen dedicated for a portable terminal device by an EMR sheet mounted below display unit 205. The EMR sheet may be provided in a touch panel that forms the display unit 205 so as to sense the proximity of the touch pen or the specific pattern of the sensing unit 640.

An example method of sensing the specific pattern in the electronic device will be described. When a current is applied to a PCB of the EMR sheet to generate resonance, the PCB current is cut off, and then an induced current by the resonance of the specific pattern of the sensing unit 640 may be measured. In addition, at least one processor may scan the EMR sheet and determines whether the specific pattern of the sensing unit 640 approaches or is contacted based on a variation of an input signal strength. Based on whether the specific pattern of the sensing unit 640 approaches or is contacted, the at least one processor may detect whether the flip cover 600 is uncovered or covered. In turn, the at least one processor may turn the screen on or off and/or execute an application accordingly.

For example, when it is detected that the specific pattern of sensing unit 640 approaches or contacts the touch panel, at least one processor may identify that flip cover 600 is covering display unit 205 and may switch the screen of the display unit 205 into the sleep mode or stop an application being executed. On the contrary, when it is detected that the specific pattern of sensing unit 640 does not contact or is moving away from the touch panel, at least one processor may identify that flip cover 600 is no longer covering display unit 205 and may switch the electronic device 100 into an active mode or may revive the stopped application.

Figure 11:
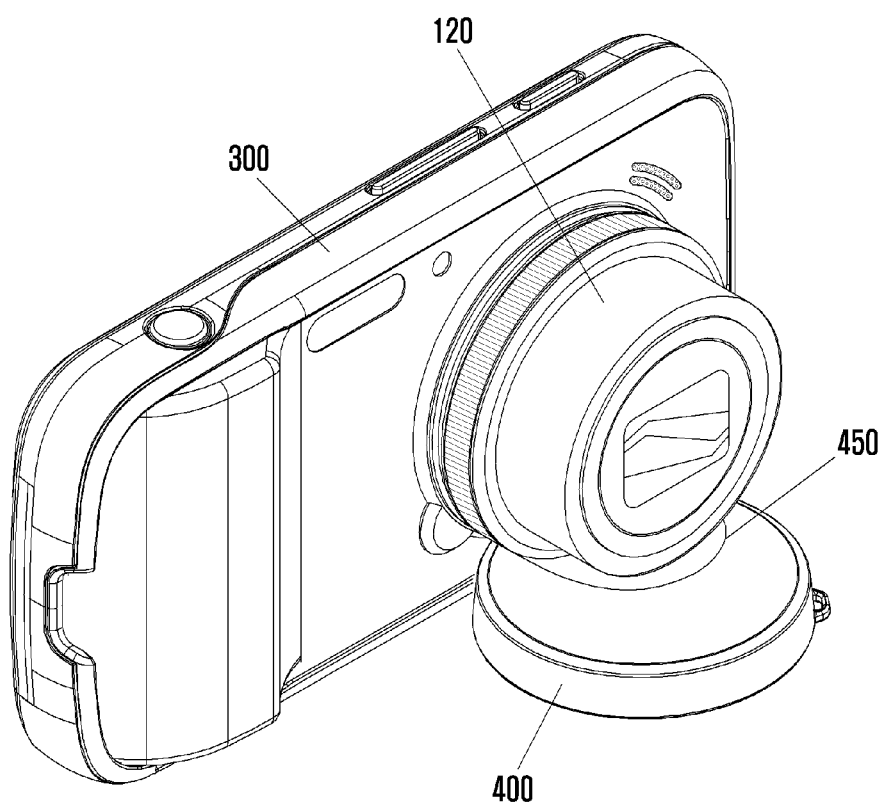
FIG. 11 is a working example of using a lens barrel cover as support in accordance with aspects of the present disclosure.

Referring now FIG. 11, the lens barrel cover 400 may be used as support for standing the electronic device 100 on a flat surface. For this purpose, a portion of the lens barrel cover 400 may include a support recess 450 dented to a predetermined depth. The support recess 450 may be formed in a concave form along a circumferential curve of the lens barrel 120.

Advantageously, a protective apparatus of an electronic device may prevent the electronic device from being damaged by external impact by employing a peripheral cover and a flip cover.

Furthermore, the peripheral cover disclosed herein may implement a physical and chemical coupling between elements of the protective apparatus using different materials. As a result, the elements of the protective apparatus which are independently fabricated in separated forms can be strongly coupled to each other and enhance the rigidity of the protective apparatus.

In another example, a flip cover may comprise a sensing unit so as to detect the state between the flip cover and a display unit of an electronic device through the sensing unit. As a result, the display unit of the electronic device can be turned ON/OFF conveniently and quickly depending on the detected state.

In one example, when a camera function of an electronic device is used, a camera phone may be stably supported on some flat surface using a support recess formed on a lens barrel to make usage of the device more convenient for the user.

In the foregoing, although multi-functioning protective apparatuses for an electronic device in accordance with aspects of the present disclosure have been described and illustrated in the specification and drawings using specific terms, the terms also have been used in general meanings merely for easily describing the contents of the present disclosure and helping the understanding of the present disclosure and do not limit the scope of the present disclosure. That is, it is apparent to those skilled in the art that other modifications based on the technical idea of the present disclosure can be implemented.

What is claimed is:

1. A protective apparatus for an electronic device, comprising:
   a first cover to enclose a peripheral surface of the electronic device; and
   a second cover, coupled to a lateral side of the first cover, to rotate about a surface of the electronic device to cover or uncover a display unit formed on the surface of the electronic device,
   wherein the first cover comprises a recess at a portion of an edge of the first cover receiving a portion of the second cover and a locker on top of the portion of the second cover.

2. The protective apparatus of claim 1, further comprising:
   a lens barrel cover formed on the first cover such that the lens barrel cover is detachable from the first cover, the lens barrel corresponding to a shape of a lens barrel formed on a rear side of the electronic device.

3. The protective apparatus of claim 2, further comprising a string connector on a circumferential surface of the lens barrel cover, the first cover being fastened by a strap of which one end is tied in a hole formed in the string connector and another end is tied in a hole formed in the first cover.

4. The protective apparatus of claim 2, wherein the portion of the lens barrel cover facing the lens is formed of a transparent polycarbonate and an inner circumferential surface of the lens barrel cover is formed of an elastic material, the inner circumferential surface being in substantially close contact with the lens barrel.

5. The protective apparatus of claim 2, wherein the lens barrel cover includes a support recess provided on a portion of a surface of the lens barrel cover that enables the electronic device to stand on a flat surface.

6. The protective apparatus of claim 1, wherein the recess is molecularly coupled to an adhered surfaces of the portion of the second cover, and wherein the portion of the second cover is molecularly coupled to an adhered surface of the locker.

7. The protective apparatus of claim 1, wherein the first cover is made of at least one of a soft material and a hard material.

8. The protective apparatus of claim 7, wherein, when the first cover is made of the soft material, the first cover is situated at a position facing a plurality of buttons formed on one lateral side of the electronic device so as to provide pushing pressure from the outside to the buttons.

9. The protective apparatus of claim 1, wherein the second cover includes at least one bending line so as to allow at least one portion of the second cover to be folded.

10. The protective apparatus of claim 9, wherein the second cover has an outer surface comprising a sheath with a stiffener such that the bending line is formed along a portion of the outer surface without the stiffener.

11. The protective apparatus of claim 9, wherein a portion of the second cover to come into at least partial contact with a rear side of the electronic device upon being folded toward the rear side of the electronic device along the bending line.

12. The protective apparatus of claim 1, wherein the second cover comprises a sensing unit providing an output based on whether at least one of a motion of the second cover moving away from the display unit and a distance between the second cover and the display unit.

13. The protective apparatus of claim 1, further comprising a sensing unit configured to be detectable when sensing unit is within a predetermined distance of the first cover.

14. The protective apparatus of claim 1, wherein the first cover comprises a lens barrel cover detached and under the lens barrel that enables the electronic device to stand on a flat surface.

15. The protective apparatus of claim 1, wherein the first cover is a peripheral cover and the second cover is a flip cover.

16. The protective apparatus of claim 1, wherein the first cover for the electronic device encloses a surface of the display unit except for a screen display surface and an external interface mounting surface, and the second cover for the electronic device includes at least two bending lines each of which enables the second cover to bend at a predetermined angle.

17. The protective apparatus of claim 1, wherein the second cover is made of at least one of polycarbonate and an elastomer.

* * * * *